United States Patent
Tamagawa et al.

(10) Patent No.: US 8,427,190 B2
(45) Date of Patent: Apr. 23, 2013

(54) POWER SUPPLY APPARATUS, POWER SUPPLY UNIT DIAGNOSTIC APPARATUS, AND METHOD FOR CONTROLLING POWER SUPPLY APPARATUS

(75) Inventors: Masahiro Tamagawa, Kawasaki (JP); Tadashi Yamada, Kawasaki (JP); Kiyoshi Sudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 333 days.

(21) Appl. No.: 12/837,611

(22) Filed: Jul. 16, 2010

(65) Prior Publication Data

US 2011/0018580 A1    Jan. 27, 2011

(30) Foreign Application Priority Data

Jul. 21, 2009    (JP) .................. 2009-169869

(51) Int. Cl.
  *G01R 31/40*    (2006.01)
  *G01R 1/00*    (2006.01)
(52) U.S. Cl.
  USPC .................... 324/764.01; 324/114
(58) Field of Classification Search .......... 324/114–115, 324/126–127, 762.01, 764.01
  See application file for complete search history.

(56) References Cited

U.S. PATENT DOCUMENTS

| | | | | |
|---|---|---|---|---|
| 7,279,921 B1* | 10/2007 | Iacob | ...................... | 324/762.03 |
| 7,309,998 B2* | 12/2007 | Burns et al. | .............. | 324/762.01 |
| 8,159,258 B2* | 4/2012 | Xie | ........................ | 324/764.01 |
| 8,228,080 B2* | 7/2012 | Priel et al. | ..................... | 324/713 |
| 8,319,516 B2* | 11/2012 | Xie | ........................ | 324/764.01 |
| 8,330,448 B2* | 12/2012 | Xie | ............................... | 324/114 |
| 2011/0140727 A1* | 6/2011 | Soldi et al. | .............. | 324/762.01 |

FOREIGN PATENT DOCUMENTS

| | | | |
|---|---|---|---|
| JP | 57-009224 A | | 1/1982 |
| JP | 60-102818 A | | 6/1985 |

* cited by examiner

*Primary Examiner* — Joshua Benitez Rosario
(74) *Attorney, Agent, or Firm* — Fujitsu Patent Center

(57) ABSTRACT

A power supply apparatus includes a power supply part including a plurality of power supply units, a first comparison unit comparing a first voltage of the power supply part with a first reference value, a directing unit issuing a voltage fall direction to one of the power supply units so as to lower a voltage setting value when the first voltage is higher than the first reference value, a second comparison unit comparing a second voltage of the power supply unit obtained after the voltage fall direction is issued with the second reference voltage value, and a determining unit determining that the power supply unit to which the voltage fall direction issued corresponds to a failure unit, when the second comparison unit detects that the second voltage obtained after the voltage fall direction is issued fell in the voltage level lower than the second reference voltage.

18 Claims, 10 Drawing Sheets

FIG.2

| ADDRESS | VARIABLE | DETAILED STATE |
|---|---|---|
| xxxx00 | 0 | POWER SUPPLY UNIT 2a IS NORMAL |
| xxxx01 | 0 | POWER SUPPLY UNIT 2b IS NORMAL |
| xxxx10 | 0 | POWER SUPPLY UNIT 2c IS NORMAL |
| xxxx11 | 1 | POWER SUPPLY UNIT 2d MALFUNCTIONS |

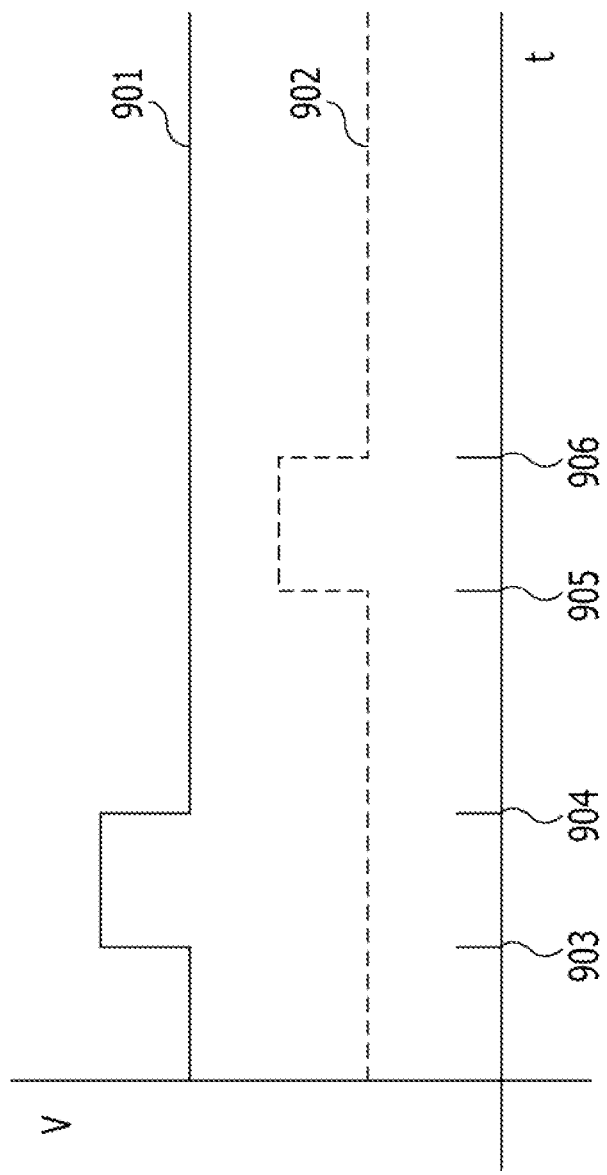

POWER SUPPLY APPARATUS, POWER SUPPLY UNIT DIAGNOSTIC APPARATUS, AND METHOD FOR CONTROLLING POWER SUPPLY APPARATUS

CROSS-REFERENCE TO RELATED APPLICATION

This application is based upon and claims priority to prior Japanese Patent Application No. 2009-169869 filed on Jul. 21, 2009 in the Japan Patent Office, the entire contents of which are incorporated herein by reference.

FIELD

The embodiment of the present invention discussed herein relates to a power supply apparatus, a power supply unit diagnostic apparatus, and a method for controlling the power supply apparatus.

BACKGROUND

Conventionally, a computer system includes a computer and a power supply apparatus which supplies power to the computer. The power supply apparatus includes a plurality of power supply units connected to one another in parallel. A voltage output from each of the power supply units is referred to respectively as a "unit output voltage", and a voltage output from the power supply apparatus is referred to as a "power supply apparatus output voltage". As a method for detecting a failure power supply unit in the system, a method for issuing an instruction for raising a unit output voltage of an arbitrary one of the power supply units connected to one another in parallel, individually, and detecting a power supply apparatus output voltage so as to determine a failure of the power supply unit has been known. This method makes use of a characteristic in which the power supply apparatus output voltage is substantially the same as the highest unit output voltage among unit output voltages output from the plurality of power supply units connected to one another in parallel. For example, when an instruction for raising a unit output voltage is supplied to a normal power supply unit among the power supply units, individually, the power supply apparatus output voltage rises. On the other hand, when an instruction for raising a voltage is supplied to a failure power supply unit among the power supply units, rise of the power supply apparatus output voltage is negligible. This characteristic will be explained with reference to FIG. 10.

FIG. 10 is a diagram illustrating voltages of a normal power supply unit and a failure power supply unit relative to an instruction for raising a voltage. In FIG. 10, a V axis corresponds to a voltage axis and a t axis corresponds to a time axis. In the following description, a power supply unit in which a unit output voltage thereof is lowered due to a failure is referred to as a "failure power supply unit". In FIG. 10, reference numerals 901 and 902 denote a power supply apparatus output voltage and a unit output voltage of a failure power supply unit, respectively. When an instruction for raising a voltage is supplied to one of normal power supply units except for the failure power supply unit at a time point 903, the power supply apparatus output voltage 901 rises. Thereafter, when the instruction for raising a voltage is cancelled at a time point 904, the power supply apparatus output voltage 901 returns. Similarly, when an instruction for raising a voltage is supplied to the failure power supply unit at a time point 905, the unit output voltage 902 rises. Thereafter, when the instruction for raising a voltage is cancelled at a time point 906, the unit output voltage 902 returns. When the instruction for raising a voltage is supplied, the unit output voltage of the failure power supply unit does not rise to the same level as that of a unit power voltage of the normal power supply unit. The unit output voltage of the failure power supply unit remains lower than the unit output voltages of the other normal power supply units. Therefore, the power supply apparatus output voltage 901 does not rise at the time point 905. Accordingly, by supplying the instruction for raising a voltage to each of the power supply units connected to one another in parallel and monitoring the power supply apparatus output voltage, a power supply unit corresponding to a power supply apparatus output voltage which barely rises can be determined as a failure power supply unit. That is, according to this determination method, a failure power supply unit is determined in accordance with a power supply apparatus output voltage output in response to an instruction for raising a voltage supplied to a power supply unit.

A technique that issues an instruction for raising a unit output voltage to a plurality of power supply units and detecting a failure power supply unit.

[Patent Document 1] Japanese Laid-open Patent Publication No. 57-009224

[Patent Document 2] Japanese Laid-open Patent Publication No. 60-102818

SUMMARY

According to an aspect of the invention, a power supply apparatus includes a power supply part including a plurality of power supply units, a first comparison unit comparing a first voltage of the power supply part with a first reference value, a directing unit issuing a voltage fall direction to one of the power supply units so as to lower a voltage setting value when the first voltage is higher than the first reference value, a second comparison unit comparing a second voltage of the power supply unit obtained after the voltage fall direction is issued with the second reference voltage value, and a determining unit determining that the power supply unit to which the voltage fall direction issued corresponds to a failure unit, when the second comparison unit detects that the second voltage obtained after the voltage fall direction is issued fell in the voltage level lower than the second reference voltage.

BRIEF DESCRIPTION OF THE DRAWINGS

FIG. 2 is a table illustrating the relationship between an address and a variable which are stored in a variable region according to the embodiment;

FIG. 10 is a diagram illustrating a voltage of a normal power supply unit and a voltage of a failure power supply unit relative to an instruction for raising a voltage.

DESCRIPTION OF EMBODIMENTS

An embodiment of the present invention will be described hereinafter with reference to the accompanying drawings.

Figure 1:
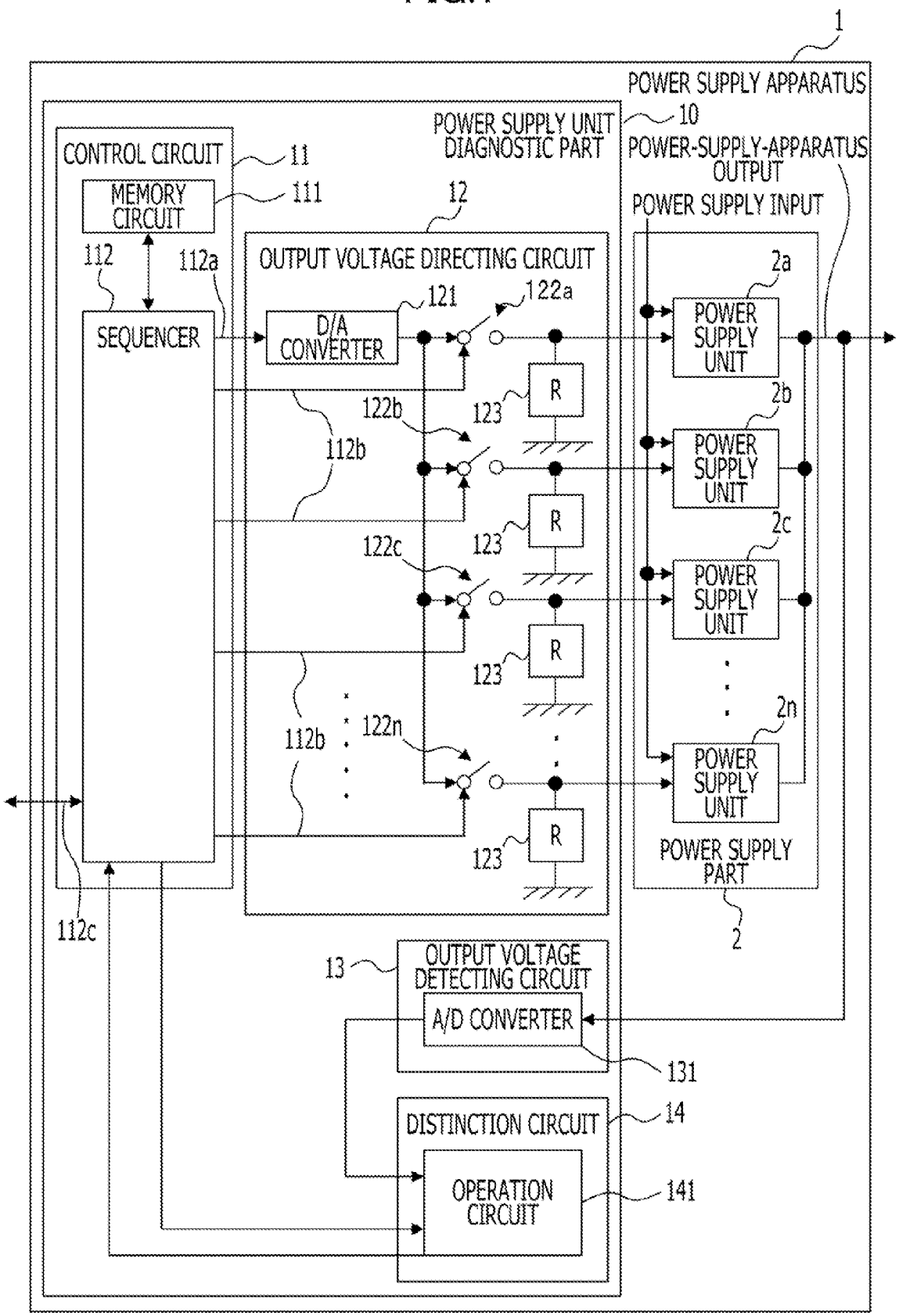
FIG. 1 is a block diagram illustrating an entire hardware configuration of a power supply apparatus according to an embodiment.

FIG. 1 is a block diagram illustrating an entire hardware configuration of a power supply apparatus according to an embodiment. A power supply apparatus 1 includes a power supply unit diagnostic part 10 and a power supply part 2. The power supply unit diagnostic part 10 includes a control circuit 11, an output voltage directing circuit 12, an output voltage detecting circuit 13, and a distinction circuit 14. The power supply apparatus 1 is incorporated in a computer system (not illustrated) and supplies electric power to computer hardware included in the computer system. The power supply part 2 includes a plurality of power supply units 2a to 2n which are connected to one another in parallel and outputs a power supply apparatus output to the computer hardware and the output voltage detecting circuit 13. A voltage of the power supply apparatus output corresponds to the power supply apparatus output voltage. The power supply unit diagnostic part 10 is electrically connected to the power supply part 2.

The control circuit 11 performs a diagnostic operation, which will be described hereinafter. The output voltage directing circuit 12 supplies an instruction for raising or lowering a unit output voltage output issued from the control circuit 11 to each of the power supply units 2a to 2n, individually. The output voltage detecting circuit 13 detects a voltage of a power supply apparatus output which is output from the power supply part 2, i.e., a power supply apparatus output voltage. The distinction circuit 14 determines a failure of each of the power supply units 2a to 2n. The circuits will be described in detail hereinafter.

The control circuit 11 includes a memory circuit 111 and a sequencer 112. The memory circuit 111 includes a program region 111a which stores programs required for operating the sequencer 112 and a variable region 111b which stores variables representing states of the power supply units 2a to 2n. In the variable region 111b, a variable "0" representing "normal" or a variable "1" representing "failure" is stored in predetermined addresses assigned to the power supply units 2a to 2n.

Information stored in the variable region 111b will be described. FIG. 2 is a table illustrating the relationship between an address and a variable which are stored in the variable region 111b according to the embodiment. As illustrated in FIG. 2, when the power supply units 2a to 2c function normally, a variable "0" is stored in the addresses corresponding to these power supply units. When the power supply unit 2d malfunctions, a variable "1" is stored in the address corresponding to this power supply unit. Although the description has been made assuming that the variable "0" denotes "normal" and the variable "1" denotes "failure", variables are not limited to these as long as information representing "normal" or information representing "failure" is associated with information on each of the power supply units 2a to 2n. The memory circuit 111 corresponds to a RAM (Random Access Memory), for example.

The sequencer 112 has an operational function and outputs a voltage directing signal 112a and a target unit directing signal 112b to the output voltage directing circuit 12. The voltage directing signal 112a is used to perform an instruction for raising or lowering a value (hereinafter referred to as a "unit setting value") which is used to set a unit output voltage and which has been set in each of the power supply units 2a to 2n. For example, unit output voltages of the power supply units 2a to 2n are set within a difference of ±5V or ±5% in accordance with the voltage directing signal 112a. In this embodiment, the voltage directing signal 112a is output through eight signal lines, for example, and has 8-bit, 256-level resolution. The target unit directing signal 112b is used to switch a target to which the voltage directing signal 112a is to be supplied among the power supply units 2a to 2n.

The sequencer 112 outputs to the distinction circuit 14 an expectational voltage value serving as a reference which is used when a failure power supply unit is to be detected. The expectational voltage value represents a voltage of 48 V, for example, and is output with 8-bit, 256-level resolution in this embodiment. The sequencer 112 corresponds to a CPU (Central Processing Unit) or an FPGA (Field Programmable Gate Array), for example. In this embodiment, the sequencer 112 includes a CPU. The control circuit 11 includes an interface 112c which is used to communicate with the computer system and a user, for example. The interface 112c corresponds to a bus which is directly connected to an inside of a computer included in the computer system, I2C (Inter-Integrated Circuit), or a USB (Universal Serial Bus), for example.

The output voltage directing circuit 12 includes a digital-to-analog converter (D/A converter) 121, analog switches 122a to 122n, and resistors 123. The D/A converter 121 converts the voltage directing signal 112a which is a digital signal into an analog signal. The analog switches 122a to 122n are used to switch, in accordance with the target unit directing signal 112b, the power supply units 2a to 2n from one to another in which the unit output voltages are varied. The analog switches 122a to 122n are arranged so as to correspond to the power supply units 2a to 2n. For example, when the analog switch 122a is turned on, the analog switch 122a outputs a TRIM input (the voltage directing signal 112a converted into an analog signal) to the power supply unit 2a. The power supply unit 2a controls a current unit setting value in accordance with a voltage applied to the TRIM input. Similarly, when the analog switches 112b to 112n are turned on, the analog switches 112b to 112n output TRIM inputs to the corresponding power supply units 2b to 2n. The resistors 123 are connected between the analog switches 122a to 122n and the power supply units 2a to 2n and are connected to the ground level (GND) so that voltages of the TRIM inputs are prevented from being instable. For example, when the analog switch 122a is in an off state, a voltage of 0 V is supplied to the power supply unit 2a from the ground through a corresponding one of the resistors 123.

Figure 3:
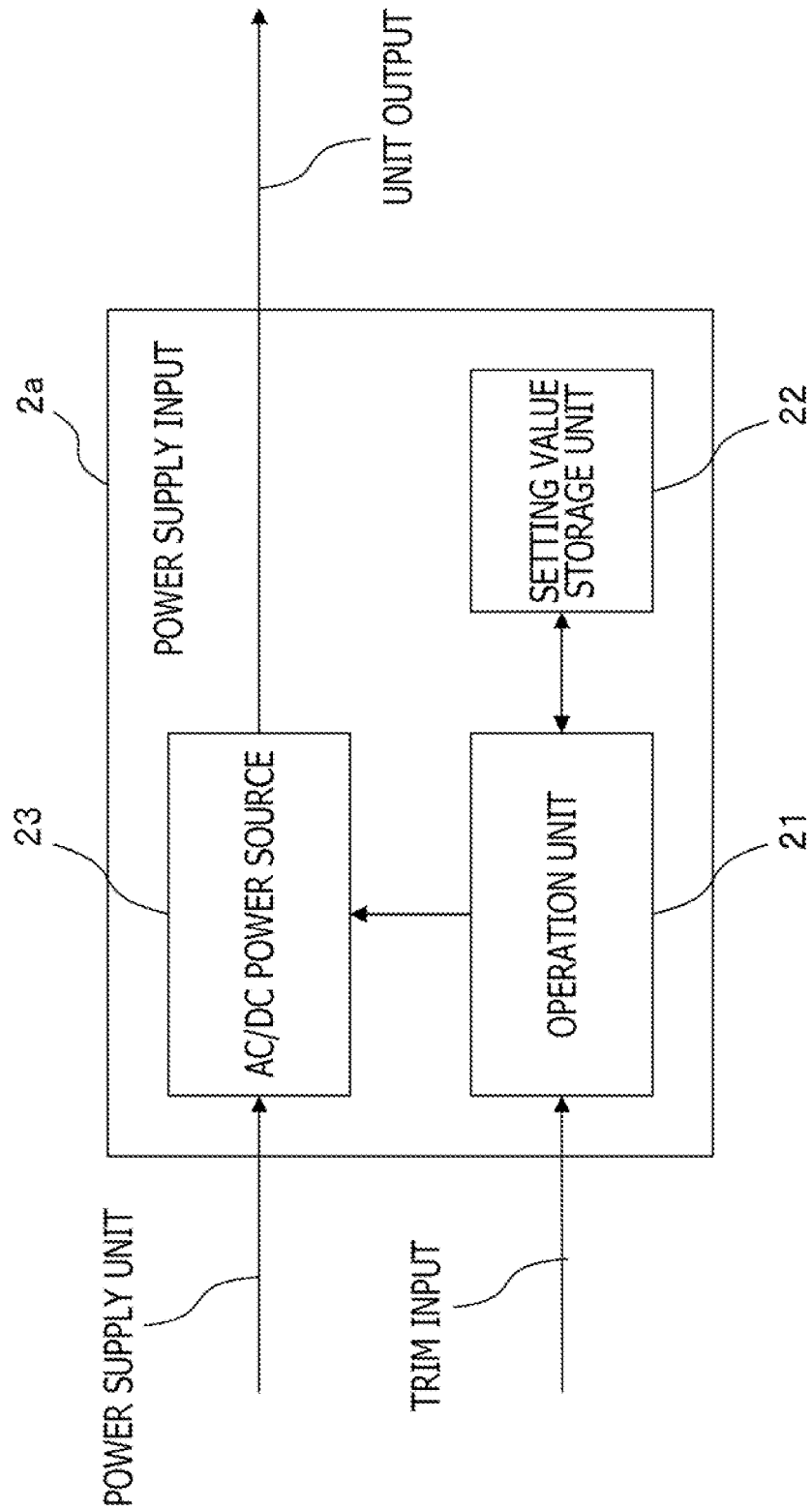
FIG. 3 is a diagram illustrating a power supply unit according to the embodiment.

The power supply units 2a to 2n receive power supply inputs and the TRIM inputs and output unit outputs. Voltages of the unit outputs correspond to the unit output voltages. The power supply inputs correspond to alternate currents. A value of each of the voltages is 200V, for example. Since the power supply units 2a to 2n are configured similarly to one another, the power supply unit 2a will be described in detail as an example hereinafter. FIG. 3 is a diagram illustrating the power supply unit 2a according to the embodiment. As illustrated in FIG. 3, the power supply unit 2a includes an operation unit 21, a setting value storage unit 22 which stores the unit setting value, and an AC/DC (Alternate Current/Direct Current) power source 23.

When a TRIM input is input, the operation unit 21 reads a unit setting value from the setting value storage unit 22 and controls the unit setting value in accordance with a voltage value applied to the TRIM input. The operation unit 21 supplies the controlled unit setting value to the AC/DC power source 23. The AC/DC power source 23 sets a voltage of a power supply input to a voltage represented by the unit setting value output from the operation unit 21, and outputs a unit output corresponding to the voltage. The unit output corresponds to a direct current. With this configuration, when the power supply unit 2a outputs a unit output of 48 V, for example, and a TRIM input representing rise of the voltage by 5% is input, a unit output of 50.4 V is set and output. On the other hand, when the TRIM input is not input, the operation unit 21 supplies the unit setting value read from the setting value storage unit 22 to the AC/DC power source 23.

The output voltage detecting circuit 13 includes an A/D (analog-to-digital) converter 131 which converts an analog signal representing the power supply apparatus output voltage into a digital signal. The output voltage detecting circuit 13 outputs the power supply apparatus output (hereinafter referred to as a "detection voltage value") converted into a digital signal using the A/D converter 131 to the distinction circuit 14. In this embodiment, the detection voltage value is output with 8-bit, 256-level resolution.

The distinction circuit 14 includes an operation circuit 141 which compares the detection voltage value with a preset reference voltage value or the expectational voltage value output from the control circuit 11 and outputs a result of the comparison to the control circuit 11. The reference voltage value is a setting value of the power supply apparatus output voltage set in a case where all the power supply units 2a to 2n included in the power supply part 2 function normally. For example, the reference voltage value represents a voltage value of 48 V serving as a reference and is used to compare with the detection voltage value obtained before the voltage directing signal 112a is output. Furthermore, the expectational voltage value is used to compare with the detection voltage value obtained after the voltage directing signal 112a is output. The reference voltage value may be the same as the expectational voltage value and only the expectational voltage value may be used to compare with the detection voltage value obtained before and after the voltage directing signal 112a is output. The operation circuit 141 is a CPU or an FPGA, for example.

Figure 4:
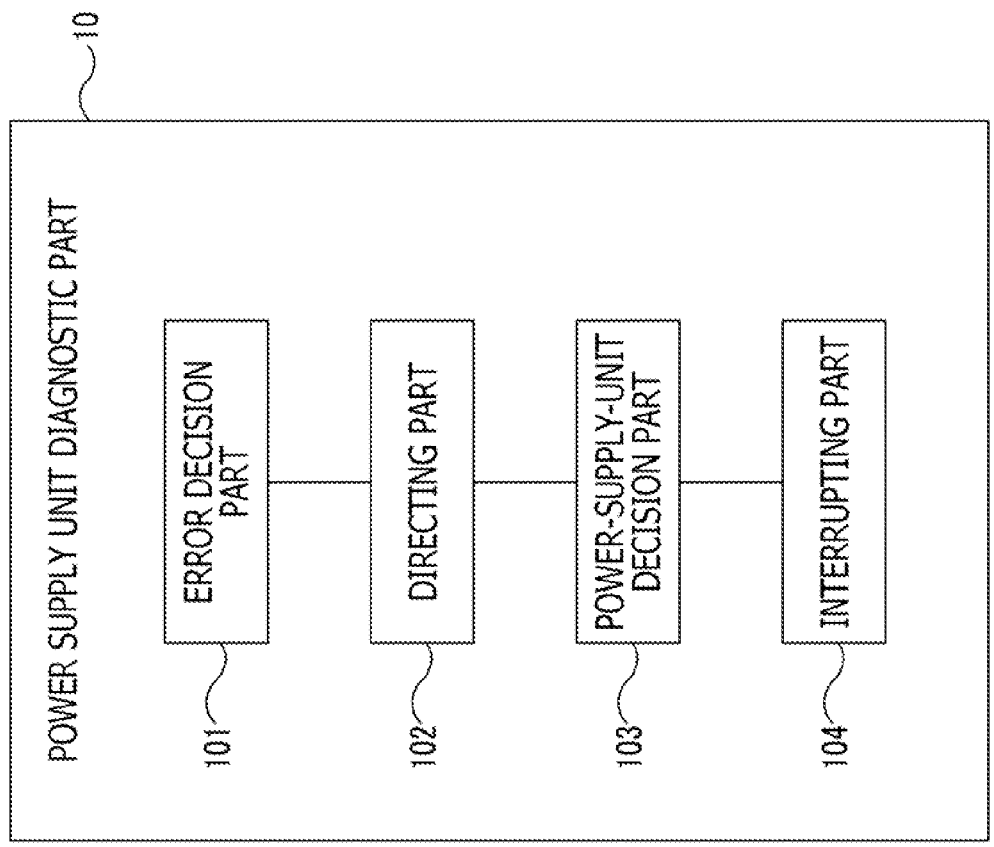
FIG. 4 is a functional block diagram illustrating a power supply unit diagnostic part according to the embodiment.

FIG. 4 is a functional block diagram illustrating the power supply unit diagnostic part 10 according to the embodiment. The power supply unit diagnostic part 10 includes an error decision part 101 which determines whether the detection voltage value corresponds to a voltage error and a directing part 102 which outputs the voltage directing signal 112a and the target unit directing signal 112b. The power supply unit diagnostic part 10 further includes a power-supply-unit decision part 103 which determines whether the voltage directing signal 112a has been output to all the power supply units 2a to 2n and an interrupting part 104 which performs an interruption process which will be described hereinafter. These functional blocks are configured with the control circuit 11 as the center. Furthermore, the error decision part 101 includes the distinction circuit 14 and the output voltage detecting circuit 13, and the directing part 102 includes the output voltage directing circuit 12. These functional blocks are realized when the hardware and software which controls the sequencer 112 operate cooperatively with each other. Alternatively, the functional blocks may be realized when the sequencer 112 does not include any software, but the hardware operate cooperatively with the software executed by a CPU (not illustrated in FIG. 1) connected to the interface 112c.

Figure 5:
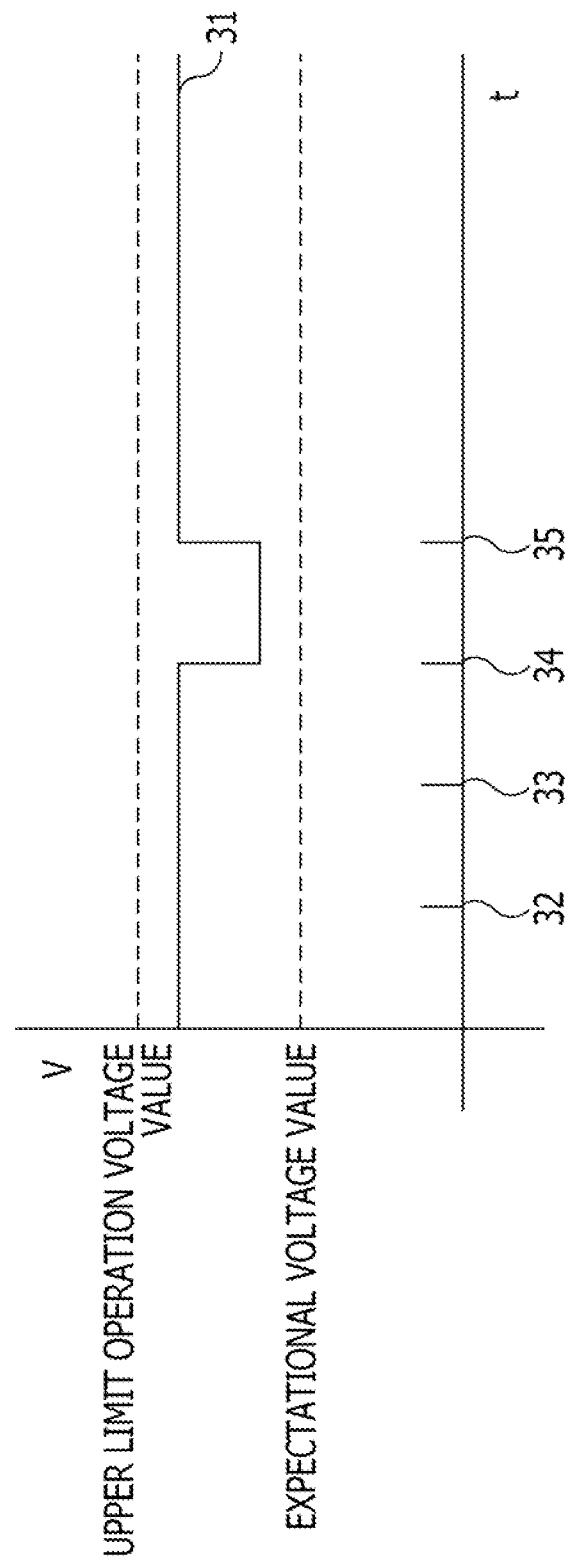
FIG. 5 is a diagram illustrating a case where a voltage directing signal representing voltage fall is output to a failure power supply unit which outputs a unit output voltage higher than a preset unit setting value in a diagnostic operation according to the embodiment.

FIG. 5 is a diagram illustrating a case where a voltage directing signal 112a representing voltage fall is supplied to a failure power supply unit which outputs a unit output voltage higher than the preset unit setting value in the diagnostic operation according to the embodiment. A reference numeral 31 illustrated in FIG. 5 represents a detection voltage value of a power supply apparatus output which is output from the power supply part 2 including a failure power supply unit. A reference numeral 32 represents a time point when a voltage directing signal 112a representing a fall of a voltage (hereinafter referred to as a "fall directing signal") is supplied to a normal power supply unit, and a reference numeral 33 represents a time point when the supply of the fall directing signal to the normal power supply unit is cancelled. A reference numeral 34 represents a time point when a fall directing signal is supplied to a failure power supply unit, and a reference numeral 35 represents a time point when the supply of the fall directing signal to the failure power supply unit is cancelled.

The detection voltage value 31 is higher than the expectational voltage value since the failure power supply unit outputs a unit output having a voltage higher than the unit setting value. When the fall directing signal is output to the normal power supply unit at the time point 32, the detection voltage value 31 is substantially the same as a value which has been detected before the fall directing signal is output. This is because the power supply apparatus output voltage changes along with a high voltage output from the failure power supply unit.

On the other hand, when the fall directing signal is supplied to the failure power supply unit at the time point 34, the detection voltage value 31 falls. Thereafter, when the fall directing signal is cancelled at the time point 35, the detection voltage value 31 returns to the original value. Therefore, it is determined that the power supply unit to which the fall directing signal has been supplied corresponds to the failure power supply unit. The detection voltage value 31 has a level similar to that of an upper-limit operation voltage value which is a setting value of an upper-limit operation voltage. Therefore, when a voltage directing signal 112a representing rise of a voltage (hereinafter referred to as a "rise directing signal") is output, it is likely that the detection voltage value 31 exceeds the upper-limit operation voltage value. However, according to the diagnostic operation of this embodiment, the detection voltage value 31 does not exceed the upper-limit operation voltage value due to the fall directing signal, and accordingly, the failure power supply unit can be detected without stopping the computer system. The diagnostic operation will be described with reference to FIGS. 6 and 7.

Figure 6:
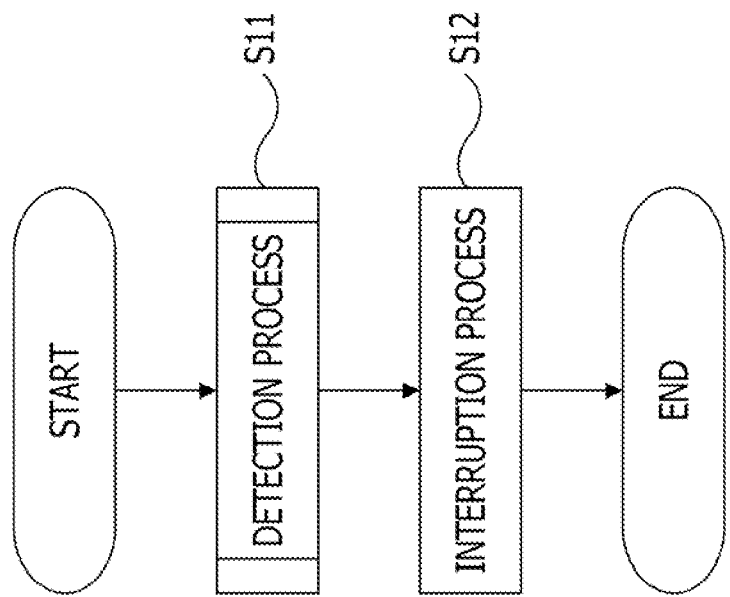
FIG. 6 is a flowchart illustrating the diagnostic operation according to the embodiment.

FIG. 6 is a flowchart illustrating the diagnostic operation according to the embodiment. First, when the diagnostic process is started in a preset cycle or in accordance with a user's instruction, the error decision part 101, the directing part 102, and the power-supply-unit decision part 103 execute a detection process in step S11 which will be described hereinafter. After the detection process, the interrupting part 104 performs an interruption process in step S12, and then, the operation is terminated.

Figure 7:
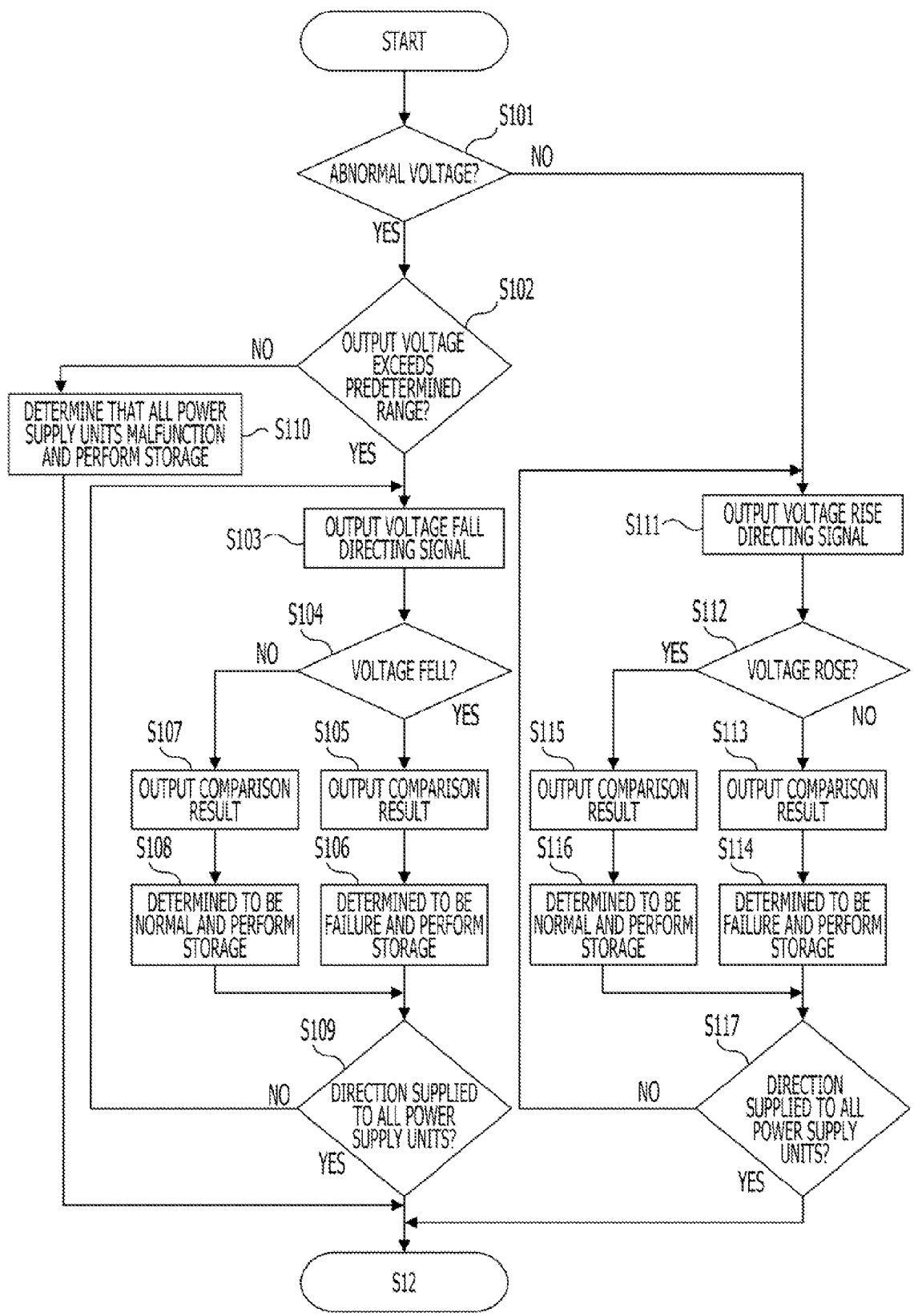
FIG. 7 is a flowchart illustrating a detection operation according to the embodiment.

FIG. 7 is a flowchart illustrating the detection operation according to the embodiment. First, the error decision part 101 determines whether the detection voltage value obtained from the output voltage detecting circuit 13 is abnormal in step S101. Here, the error decision part 101 makes the determination by comparing the reference voltage value included in the distinction circuit 14 with the detection voltage value so as to determine whether the detection voltage value is within a predetermined range including the reference voltage value. The predetermined range may be appropriately set such as a range of ±5V of the reference voltage value or a range of ±5% of the reference voltage value. When the detection voltage value is abnormal, that is, when the detection voltage value is out of the predetermined range (when the determination is affirmative in step S101), the error decision part 101 determines whether the detection voltage value exceeds the predetermined range in step S102. When the detection voltage value exceeds the predetermined range (when the determination is affirmative in step S102), the error decision part 101 outputs a result of the determination to the control circuit 11. The directing part 102 determines a power supply unit selected in accordance with the input determination result as a directing target, and outputs a fall directing signal to the power supply unit (hereinafter referred to as a "target-directing power supply unit") serving as the directing target through the output voltage directing circuit 12 in step S103. In this embodiment, the target power supply unit is set in descending order of values of the addresses (hereinafter referred to as "address values") included in the memory circuit 111, and here, the power supply unit 2a is set as the target power supply unit. The target power supply unit may be set in ascending order. The directing part 102 outputs the target unit directing signal 112b to the analog switch 122a corresponding to the power supply unit 2a so that the analog switch 122a is turned on.

After outputting the fall directing signal, the error decision part 101 determines whether the detection voltage value falls within an error margin range based on the fall directing signal in step S104. For example, assuming that the detection voltage value is 48 V before a fall directing signal representing fall of the unit output voltage by 5% is output and a margin of error is ±1%, it is determined whether the detection voltage value is in a range 45.6 V±1% after the fall directing signal is output. The margin of error may be ±2% or ±2 V. When the detection voltage value falls to the error margin range based on the fall directing signal (when the determination is affirmative in step S104), the error decision part 101 determines the power supply unit 2a to be a failure power supply unit and outputs a variable "1" (for example, 3.3 V) as a comparison result to the control circuit 11 in step S105. After the variable "1" is output, the power-supply-unit decision part 103 determines that the power supply unit 2a malfunctions in accordance with the comparison result "1" supplied to the control circuit 11, and stores information specifying the power supply unit 2a and the comparison result in the memory circuit 111 in step S106. That is, the power-supply-unit decision part 103 replaces a variable corresponding to the power supply unit 2a which has been stored in the variable region Mb in the memory circuit 111 by "1". After the storage, the directing part 102 cancels the output of the fall directing signal to the power supply unit 2a.

On the other hand, when the detection voltage value does not fall to the error margin range based on the fall directing signal (when the determination is negative in step S104), the error decision part 101 outputs a variable "0" (0V, for example) to the control circuit 11 as a comparison result in step S107. Then, in accordance with the comparison result "0" supplied to the control circuit 11, the power-supply-unit decision part 103 determines that the power supply unit 2a functions normally and stores information specifying the power supply unit 2a and the comparison result in the memory circuit 111 in step S108. That is, the power-supply-unit decision part 103 replaces the variable corresponding to the power supply unit 2a which has been stored in the variable region Mb in the memory circuit 111 by "0". After the replacement, the directing part 102 cancels the output of the fall directing signal to the power supply unit 2a.

Next, the power-supply-unit decision part 103 determines whether the fall directing signal has been supplied to all the power supply units 2a to 2n in step S109. In this embodiment, since the fall directing signal is output in descending order of the address values, the power-supply-unit decision part 103 determines whether the fall directing signal has been supplied to a power supply unit corresponding to the last address value. The power-supply-unit decision part 103 may make a determination in accordance with a history of storage of comparison results in the memory circuit 111 or information representing a power supply unit to which the fall directing signal or a target-power-supply-unit directing signal is supplied which has been stored in the power-supply-unit decision part 103. When the fall directing signal has been output to all the power supply units 2a to 2n (when the determination is affirmative in step S109), the interrupting part 104 performs the interruption operation in step S12. On the other hand, when at least one of the power supply units 2a to 2n has not received the fall directing signal (when the determination is negative in step S109), the directing part 102 sets a power supply unit in the next address as the target power supply unit in step S103 and performs the operation of outputting the fall directing signal.

Furthermore, when the detection voltage value is lower than the predetermined range in step S102 (when the determination is negative in step S102), the error decision part 101 determines that all the power supply units 2a to 2n malfunction and outputs a result of the determination to the control circuit 11. In accordance with the determination result, the power-supply-unit decision part 103 stores the determination result in the memory circuit 111 in step S110. Specifically, the power-supply-unit decision part 103 replaces variables corresponding to all the power supply units 2a to 2n which have been stored in the variable region 111b in the memory circuit 111 by "1". After the replacement, the interrupting part 104 performs the interruption operation in step S12.

Moreover, in step S101, when the detection voltage value is normal, that is, when the detection voltage value is within the predetermined range (when the determination is negative in step S101), the error decision part 101 outputs a result of the determination to the control circuit 11. The directing part 102 sets a target power supply unit in accordance with the supplied determination result, and outputs a rise instruction signal representing rise of an output voltage to the target power supply unit serving as a directing target through the output voltage directing circuit 12 in step S111. Here, the target power supply unit corresponds to the power supply unit 2a. The directing part 102 outputs the target unit directing signal 112b together with the rise directing signal to the analog switch 122a corresponding to the power supply unit 2a so that the analog switch 122a is turned on.

After the rise directing signal is output, the error decision part 101 determines whether the detection voltage value rises to the error margin range based on the rise directing signal in step S112. For example, assuming that the detection voltage value is 48 V before a rise directing signal representing rise of the unit output voltage by 5% is output and a margin of error is ±1%, it is determined whether the detection voltage value is in a range 50.4V±1% after the rise directing signal is output. When the detection voltage value does not rise to the error margin range based on the rise directing signal (when the determination is negative in step S112), the error decision part 101 determines the power supply unit 2a to be a failure power supply unit and outputs a variable "1" as a comparison result to the control circuit 11 in step S113. After the variable "1" is output, the power-supply-unit decision part 103 determines that the power supply unit 2a malfunctions in accordance with the comparison result "1" supplied to the control circuit 11, and stores information specifying the power supply unit 2a and the comparison result in the memory circuit 111 in step S114. Then, the directing part 102 cancels the output of the rise directing signal to the power supply unit 2a.

On the other hand, when the detection voltage value rises to the error margin range based on the rise directing signal (when the determination is affirmative in step S112), the error decision part 101 outputs a variable "0" to the control circuit 11 as a comparison result in step S115. Thereafter, in accordance with the comparison result "0" supplied to the control circuit 11, the power-supply-unit decision part 103 determines that the power supply unit 2a functions normally and stores information specifying the power supply unit 2a and the comparison result in the memory circuit 111 in step S116. After the storage of the comparison result, the directing part 102 cancels the output of the rise directing signal to the power supply unit 2a.

Next, the power-supply-unit decision part 103 determines whether the rise directing signal has been supplied to all the power supply units 2a to 2n in step S117. In this embodiment, since the rise directing signal is output in descending order of the address values, the power-supply-unit decision part 103 determines whether the rise directing signal has been supplied to a power supply unit corresponding to the last address value.

When the rise directing signal has been supplied to all the power supply units 2a to 2n (when the determination is affirmative in step S117), the interrupting part 104 performs the interruption operation in step S12. On the other hand, when at least one of the power supply units 2a to 2n has not received the fall directing signal (when the determination is negative in step S117), the directing part 102 sets a power supply unit in the next address as the target power supply unit in step S111 and performs the operation of outputting the rise directing signal.

Next, the interruption operation performed in step S12 according to this embodiment will be described in detail.

After the detection operation, the interrupting part 104 performs the interruption operation on a CPU in which an OS (Operating System) which controls the power supply unit diagnostic part 10 operates. In this embodiment, the CPU in which an OS which controls the power supply unit diagnostic part 10 operates corresponds to a CPU included in the sequencer 112. Therefore, since the diagnostic operation is performed as a program which operates in the OS, the interrupting part 104 performs the interruption operation on the power supply unit diagnostic part 10. After the interruption operation, the interrupting part 104 reads state information such as variables representing states of the power supply units 2a to 2n which have been stored in the memory circuit 111 or detailed states. When the read state information includes information representing the failure power supply unit, the interrupting part 104 generates a log representing occurrence of a failure including the information on the failure power supply unit and outputs a message representing the occurrence of a failure to the user or a console so as to notify the user of the occurrence of a failure in the power supply unit. The interrupting part 104 may output all state information stored in the memory circuit 111.

In the interruption operation according to this embodiment, the CPU in which the OS which controls the power supply unit diagnostic part 10 operates corresponds to the CPU included in the sequencer 112. However, if the OS corresponds to an OS of the computer system including the power supply apparatus 1, the following interruption operation is performed. After the detection operation, the interrupting part 104 performs an interruption operation on the CPU of the computer system which executes the OS which controls the power supply unit diagnostic part 10. The OS which is executed by the CPU which has been interrupted reads state information stored in the memory circuit 111 through the interface 112c. When the read information includes information on the failure power supply unit, the OS generates a log representing occurrence of a failure including the information on the failure power supply unit and outputs a message representing the occurrence of a failure to the user or a console so as to notify the user of the occurrence of a failure in the power supply unit.

In this embodiment, the power supply apparatus 1 is incorporated in the computer system. However, the computer system may be externally connected to the power supply apparatus 1. Alternatively, the power supply unit diagnostic part 10 may be incorporated in the system as a device included in the computer system and the computer system may be externally connected to the power supply part 2. Furthermore, the computer system may be externally connected to the power supply unit diagnostic part 10 and the power supply part 2 may be incorporated in the system as a device included in the system. A power supply input may be direct current instead of alternate current. In this case, each of the power supply units 2a to 2n includes a DC/DC converter (direct current-to-direct current voltage converter) instead of the AC/DC power source 23.

Although the rise directing signal and the fall directing signal are cancelled after the storage of the comparison result in this embodiment, the directing part 102 may output the target unit directing signal 112b while the directing signals are output and operate the switch. Although the information specifying the power supply unit 2a and the comparison result are stored in the memory circuit 111 when it is determined that the target power supply unit functions normally in this embodiment, the comparison result may not be stored. Although the control circuit 11 and the distinction circuit 14 are separately described in this embodiment, the control circuit 11 may include an operational function the same as that of the distinction circuit 14 and the distinction circuit 14 may be eliminated. Although the interruption operation is performed after the fall directing signal or the rise directing signal is output to the power supply units 2a to 2n in this embodiment, the interruption operation may be performed when the failure power supply unit is specified.

The fall directing signal is used for instruction for lowering the unit setting value in this embodiment. However, the fall directing signal may represent the unit setting value. In this case, the error decision part 101 calculates a difference between the detection voltage value obtained before the fall directing signal is output and the reference voltage value, and the directing part 102 outputs a fall directing signal representing a voltage value obtained by subtracting the difference from the unit setting value in the target voltage unit. Furthermore, in this case, each of the power supply units 2a to 2n does not include the operation unit 21 and the setting value storage unit 22. The rise directing signal may represent the unit setting value.

Figure 8:
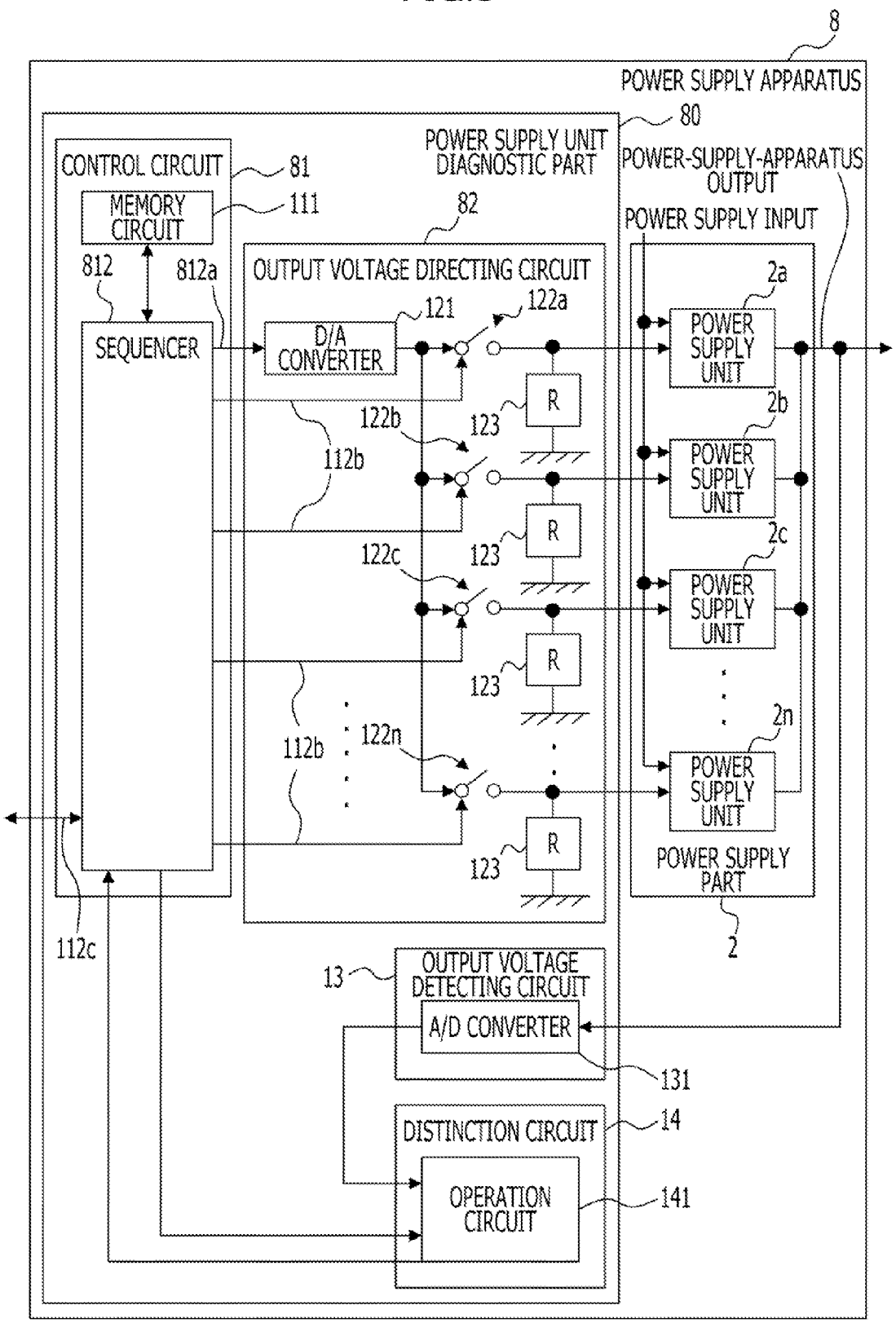
FIG. 8 is a block diagram illustrating an entire hardware configuration of a power supply apparatus to which a technique disclosed in this application is not applied.

As a comparative example, a power supply apparatus to which the technique disclosed in this application is not applied will be described. FIG. 8 is a block diagram illustrating an entire hardware configuration of a power supply apparatus to which the technique disclosed in this application is not applied. A power supply apparatus 8 in this comparative example includes a power supply unit diagnostic part 80 instead of the power supply unit diagnostic part 10 of the power supply unit diagnostic part 10 included in the power supply apparatus 1. The power supply unit diagnostic part 80 includes a control circuit 81 and an output voltage directing circuit 82 instead of the control circuit 11 and the output voltage directing circuit 12 included in the power supply unit diagnostic part 10, respectively. The control circuit 81 includes a sequencer 812 which outputs a voltage rise directing signal 812a only representing a direction of rise of an output voltage instead of the sequencer 112 which outputs the voltage directing signal 112a representing a direction of fall or rise of an output voltage included in the control circuit 11. The power supply apparatus 8 performs diagnosis on the power supply units 2a to 2n using the voltage rise directing signal 812a so as to detect a failure. The output voltage directing circuit 82 transmits the voltage rise directing signal 812a output from the control circuit 81 to the power supply units 2a to 2n.

Figure 9:
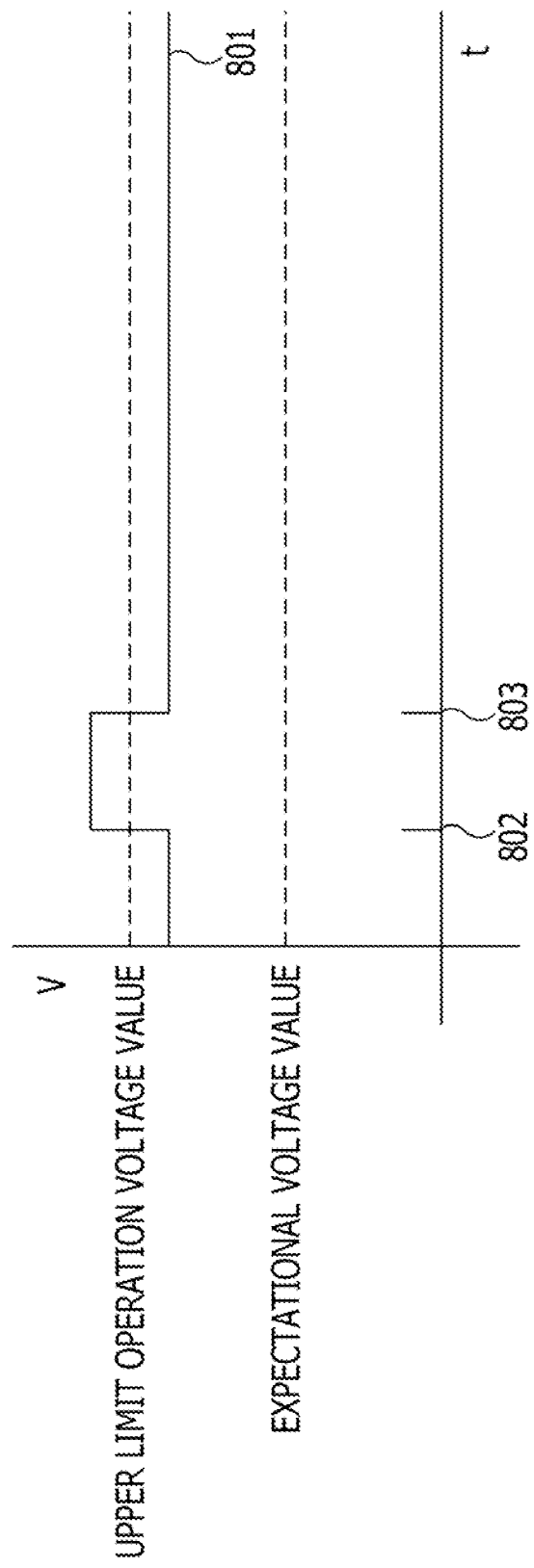
FIG. 9 is a diagram illustrating a case where a voltage directing signal is supplied to a failure power supply unit which outputs a unit output voltage higher than a preset unit setting value in the power supply apparatus to which the technique disclosed in this application is not applied.

FIG. 9 is a diagram illustrating a case where the voltage directing signal is supplied to a failure power supply unit which outputs a unit output voltage higher than a preset unit setting value in the power supply apparatus to which the technique disclosed in this application is not applied. In FIG. 9, a reference numeral 801 represents a detection voltage value of a power supply apparatus output which is output from a power supply part 2 including a failure power supply unit. A reference numeral 802 represents a time point when the voltage rise directing signal 812a is output, and a reference numeral 803 represents a time point when the output of the voltage rise directing signal 812a is cancelled. The detection voltage value 801 is higher than an expectational voltage value since the failure power supply unit outputs a unit output having a voltage higher than the unit setting value. The power supply apparatus 8 outputs the voltage rise directing signal 812a to the failure power supply unit at the time point 802. When the voltage rise directing signal 812a is output, the detection voltage value 801 exceeds an upper-limit operation voltage value until the time point 803. Therefore, normal operation of a computer system is not ensured when the diagnosis is performed for detecting the failure power supply unit in the power supply apparatus 8.

On the other hand, according to the embodiment, when the detection voltage value exceeds the expectational voltage value, a fall directing signal is output in order to lower unit output voltages which are output from the individual power supply units 2a to 2n for the failure diagnosis. By outputting the fall directing signal, the failure power supply unit can be detected while the detection voltage value does not exceed the upper-limit voltage value. In addition, even for the failure power supply unit in which the unit output voltage is lowered, the failure power supply unit can be detected since the rise directing signal can be output.

In Claims, first and second comparison units and a specifying unit correspond to the error decision part 101, for example. First and second directing units correspond to the directing part 102, for example. A storage unit and a rewriting unit correspond to the power-supply-unit decision part 103, for example. A notifying unit corresponds to the interrupting part 104, for example. First to third output voltages correspond to the detection voltage value, for example. A first predetermined threshold value corresponds to an upper-limit voltage value in the predetermined range of the reference voltage value, and a third predetermined threshold value corresponds to a lower-limit voltage value in the predetermined range of the reference voltage value, for example. A second predetermined threshold value corresponds to an upper-limit voltage value in the error margin range of the expectational voltage value, and a fourth predetermined threshold value corresponds to a lower-limit voltage value in the error margin range of the expectational voltage value, for example. A setting value corresponds to the unit setting value, for example. A direction for lowering the setting value corresponds to the fall directing signal and a direction for raising the setting value corresponds to the rise directing signal, for example. State information corresponds to the variables or the detailed states, for example. A power supply unit diagnostic apparatus corresponds to the power supply unit diagnostic part, for example.

What is claimed is:

1. A power supply apparatus comprising:
   a power supply part that includes a plurality of power supply units connected to one another in parallel;
   a first comparison unit that compares a first output voltage of the power supply part with a first reference voltage value;
   a directing unit that issues a voltage fall direction to one of the power supply units so as to lower a setting value of a voltage outputted from the power supply unit when the first output voltage is higher than the first reference voltage value;
   a second comparison unit that compares a second output voltage of the power supply unit obtained after the voltage fall direction is issued with the second reference voltage value; and
   a determining unit that determines that the power supply unit to which the voltage fall direction has been issued corresponds to a failure power supply unit, when the second comparison unit detects that the second output voltage obtained after the voltage fall direction is issued fell in the voltage level lower than the second reference voltage value.

2. The power supply apparatus according to claim 1, wherein the directing unit issues a voltage rise direction for increasing the setting value of an output voltage to one of the power supply units when the first output voltage is equal to or lower than the first reference voltage value and is equal to or higher than a third reference voltage value,
   the second comparison unit compares a third output voltage of the power supply unit obtained after the voltage rise direction is issued with the fourth reference voltage value, and
   the determining unit determines that the power supply unit to which the voltage rise direction has been supplied corresponds to a failure power supply unit, when the second comparison unit detects that the third output voltage obtained after the voltage rise direction is issued becomes lower than the first output voltage.

3. The power supply apparatus according to claim 2, wherein the determining unit determines that all the power supply units malfunction when the first output voltage is lower than the third reference voltage value.

4. The power supply apparatus according to claim 1, further comprising:
   a storage unit that stores state information representing states of the power supply units; and
   a rewriting unit that replaces the state information corresponding to the power supply unit determined to be the failure power supply unit by the determining unit by state information representing a failure.

5. The power supply apparatus according to claim 4, further comprising:
a notifying unit that notifies the state information stored in the storage unit of the power supply units to an external apparatus.

6. The power supply apparatus according to claim 5,
wherein the notifying unit generates information on a log of occurrence of a failure in accordance with the state information of the power supply unit replaced by the state information representing a failure and notifies a message representing the occurrence of a failure to the external apparatus.

7. A power supply unit diagnostic apparatus for performing diagnosis on a plurality of power supply units connected to one another in parallel and included in a power supply part of a power supply apparatus, the power supply unit diagnostic apparatus comprising:
a first comparison unit which compares a first output voltage of the power supply part with a first reference voltage value;
a directing unit that issues a voltage fall direction to one of the power supply units so as to lower a setting value of a voltage outputted from the power supply unit when the first output voltage is higher than the first reference voltage value;
a second comparison unit that compares the second output voltage of the power supply unit obtained after the voltage fall direction is issued with the second reference voltage value; and
a determining unit that determines that the power supply unit to which the voltage fall direction has been supplied corresponds to a failure power supply unit, when the second comparison unit detects that the second output voltage obtained after the voltage fall direction is issued fell in the voltage level lower than the second reference voltage value.

8. The power supply unit diagnostic apparatus according to claim 7,
wherein the directing unit issues a voltage rise direction for increasing the setting value of an output voltage to one of the power supply units when the first output voltage is equal to or lower than the first reference voltage value and equal to or higher than a third reference voltage value,
the second comparison unit compares a third output voltage of the power supply unit obtained after the voltage rise direction is issued with the fourth reference voltage value, and
the determining unit determines that the power supply unit to which the voltage rise direction has been supplied corresponds to a failure power supply unit, when the second comparison unit detects that the third output voltage obtained after the voltage rise direction is issued becomes lower than the first output voltage.

9. The power supply unit diagnostic apparatus according to claim 8, wherein the determining unit determines that all the power supply units malfunction when the first output voltage is lower than the third reference voltage value.

10. The power supply unit diagnostic apparatus according to claim 7, further comprising:
a storage unit that stores state information representing states of the power supply units; and
a rewriting unit that replaces the state information corresponding to the power supply unit determined to be the failure power supply unit by the determining unit by state information representing a failure.

11. The power supply unit diagnostic apparatus according to claim 10, further comprising a notifying unit that notifies the state information stored in the storage unit of the power supply units to an external apparatus.

12. The power supply unit diagnostic apparatus according to claim 11, wherein the notifying unit generates information on a log of occurrence of a failure in accordance with the state information of the power supply unit replaced by the state information representing a failure and notifies a message representing the occurrence of a failure to the external apparatus.

13. A method of controlling a power supply apparatus including a power supply part having a plurality of power supply units connected to one another in parallel, the method comprising:
comparing a first output voltage of the power supply unit part with a first reference voltage value;
issuing a voltage fall direction to one of the power supply units so as to lower a setting value of a voltage outputted from the power supply unit when the first output voltage is higher than the first reference voltage value;
comparing a second output voltage of the power supply unit obtained after the voltage fall direction is issued with the second reference voltage value; and
determining that the power supply unit to which the voltage fall direction has been supplied corresponds to a failure power supply unit, when it is detected in the comparing the second output voltage that the second output voltage obtained after the voltage fall direction is issued fell in the voltage level lower than the second reference voltage value.

14. The method of controlling a power supply apparatus according to claim 13,
wherein a voltage rise direction for increasing the setting value of an output voltage is issued to one of the power supply units when the first output voltage is equal to or lower than the first reference voltage value and equal to or higher than a third reference voltage value,
it is detected at the comparing the second output voltage whether a third output voltage of the power supply unit obtained after the voltage rise direction is issued with the fourth reference voltage value, and
it is determined at the determining that the power supply unit to which the voltage rise direction has been supplied corresponds to a failure power supply unit, when the third output voltage obtained after the voltage rise direction is issued becomes lower than the first output voltage.

15. The method of controlling a power supply apparatus according to claim 14, wherein it is determined that all the power supply units malfunction when the first output voltage is lower than the third reference voltage value.

16. The method of controlling a power supply apparatus according to claim 13, further comprising:
storing state information representing states of the power supply units; and
replacing the state information corresponding to the power supply unit determined to be the failure power supply unit by the determining unit by state information representing a failure.

17. The method of controlling a power supply apparatus according to claim 16, further comprising notifying the stored state information of the power supply units to an external apparatus of.

18. The method of controlling a power supply apparatus according to claim 17, wherein information on a log of occurrence of a failure is generated in accordance with the state information of the power supply unit replaced by the state information representing a failure and the external apparatus is notified of a message representing the occurrence of a failure.

* * * * *